United States Patent [19]

Fennel

[11] Patent Number: 4,581,713
[45] Date of Patent: Apr. 8, 1986

[54] METHOD OF AND ARRANGEMENT FOR PRODUCING NUMERICAL VALUES PROPORTIONAL TO THE FREQUENCY OF MEASURED PULSES OF A MEASURED PULSE TRAIN

[75] Inventor: Helmut Fennel, Frankfurt am Main, Fed. Rep. of Germany

[73] Assignee: ITT Industries, Inc., New York, N.Y.

[21] Appl. No.: 480,209

[22] Filed: Mar. 30, 1983

[30] Foreign Application Priority Data

Apr. 15, 1982 [DE] Fed. Rep. of Germany ....... 3213801

[51] Int. Cl.[4] ............................................ G01P 21/00
[52] U.S. Cl. .................................... 364/571; 364/565; 377/49
[58] Field of Search ....................... 364/571, 565, 566; 377/39, 47, 49, 50; 318/603; 375/10, 94, 95

[56] References Cited

U.S. PATENT DOCUMENTS

| | | | |
|---|---|---|---|
| 3,892,952 | 7/1975 | Shibata et al. | 364/565 |
| 4,101,838 | 7/1978 | Aihara et al. | 377/47 |
| 4,405,980 | 9/1983 | Hess | 364/200 |
| 4,420,814 | 12/1983 | Arikawa | 377/39 |
| 4,434,470 | 2/1984 | Thomas et al. | 364/565 |
| 4,462,110 | 7/1984 | Baldwin et al. | 377/47 |
| 4,485,452 | 11/1984 | Cording et al. | 364/565 |

Primary Examiner—Errol A. Krass
Assistant Examiner—Heather R. Herndon
Attorney, Agent, or Firm—James B. Raden; William J. Michals

[57] ABSTRACT

A method and a device for the generation of numerical values which are proportional to the frequency of the measured pulses of a measured-pulse train are proposed which make available the numerical values covering a wide measuring range with high precision and in a shortest possible time. To this end, in invariably predetermined reference time intervals, the number of the periods of the measured pulses is in each case measured as an approximate value for the frequency, and a correction value is added to the approximate value. The correction values are contained in at least one table as table values under respective addresses, the table values being derived from the difference between the time durations measured in successive reference time intervals up to the respective last measured pulse in the reference time interval. The table values are proportional to the reciprocal value of the total of the reference time interval and the difference between the time durations measured in the successive reference time intervals up to the respective last pulse in the interval.

23 Claims, 4 Drawing Figures

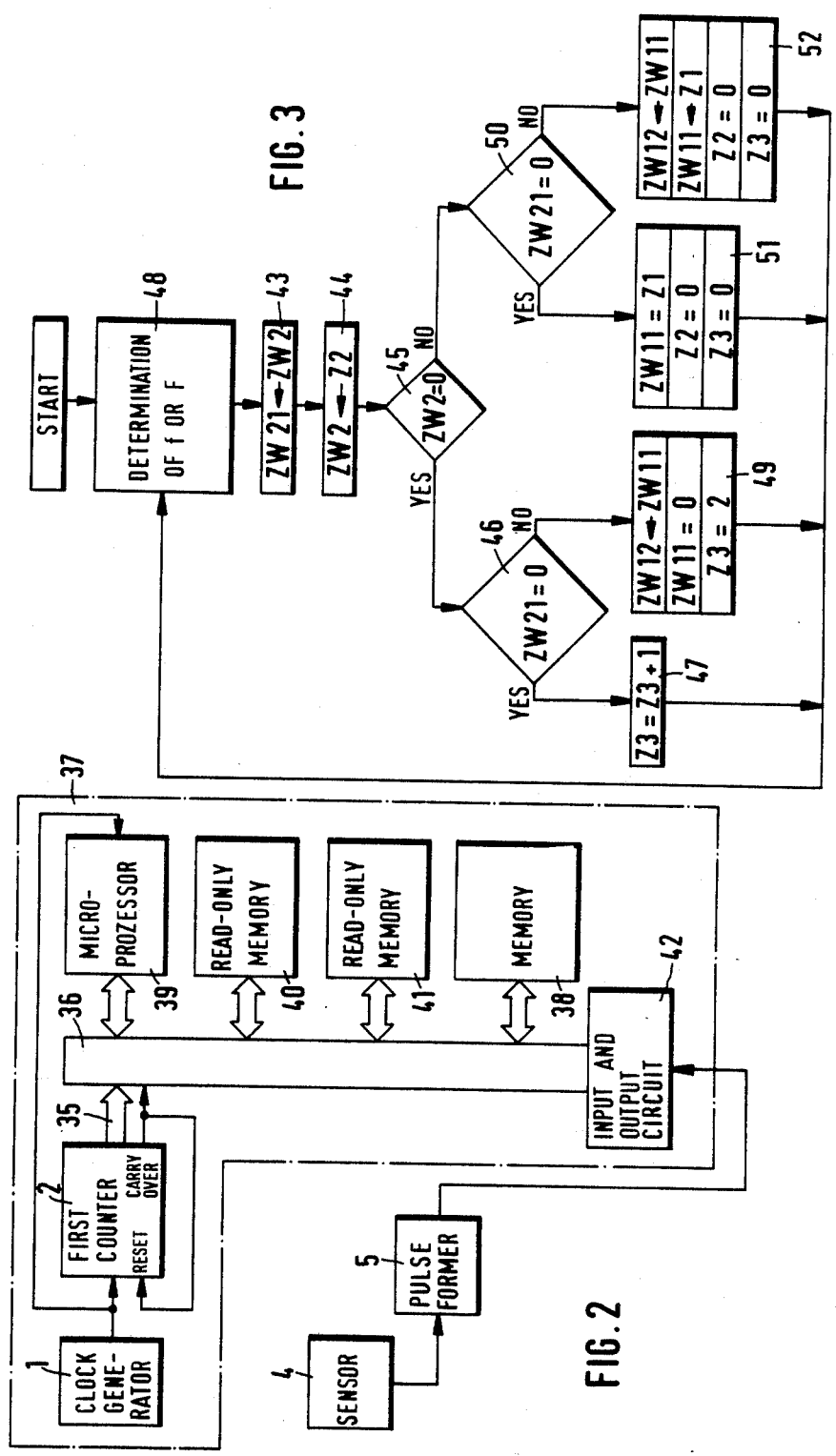

METHOD OF AND ARRANGEMENT FOR PRODUCING NUMERICAL VALUES PROPORTIONAL TO THE FREQUENCY OF MEASURED PULSES OF A MEASURED PULSE TRAIN

BACKGROUND OF THE INVENTION

The present invention relates to a method of producing numerical values which are proportional to the frequency of measured pulses of a measured pulse train and to an arrangement for performing this method.

Rotational speeds can be measured by pulse generators producing pulse trains whose frequencies are proportional to the rotational speeds. An exact registering of the velocity can be attained by measuring the pulse-to-pulse period. To this end, clock pulses of an oscillator which delivers a pulse train with constant frequency are counted during the pulse-to-pulse period. When it is desired to calculate the rotational speeds on the basis of these counted values, reciprocal values will have to be formed.

There is known from the published German Application P No. 30 03 876 a method for speed determination, wherein the measured pulse of a pulse converter serves to initiate the counting of clock pulses until the number of clock pulses corresponds to a presettable time. This counting action will then be continued until the next pulse of a definable number of measured pulses occurs. The velocity sought will be determined by the ratio of the total number of the clock pulses counted to the preset number of measured pulses. According to this method, speed determination can be obtained by division only. It is often desired to sense the velocity with great accuracy. In doing so, there result figures with several digits. These figures can be divided in a relatively short time only while using extensive circuit configurations. With relatively little expenditure in circuit schemes, there ensue long calculating periods due to the sequential processing of the individual digits.

The calculating period is frequently limited by the interval between two adjacent pulses of a pulse generator sensing the velocity. In case the velocity varies within a great range, differently long periods are available for the calculating operations. Velocities that are varying within great ranges occur, for instance, with vehicle wheels. In vehicles incorporating anti-skid control devices, the rotational speeds are monitored by sensors associated with the wheels. In a device for preventing a wheel lock when braking that is known from the British Application No. 2,052,902, a sensor arranged on the drive shaft is connected via pulse-former circuits to input circuits which are connected with the bus of a microprocessor. In addition, memories and counters are connected to the bus. This bus comprises a data bus, an address bus and a control bus. In between two adjacent pulses of the sensor, the clock pulses of a clock generator are summed up in the counters. The rates of counted values which occurred in several pulse periods are stored in a series of registers from which they are called off by the microprocessor for the speed calculation. With each pulse of the sensor, an interrupt is demanded from the microprocessor. This interrupt will commence the speed calculation only when the calculating period required is shorter than the pulse period. However, if the pulse period is shorter than a predetermined period that is commensurate with the calculating period, the interrupt signal will be rendered inoperative by masking until the calculating action has been completed. Only the subsequent interrupt signals will cause a new speed calculation.

SUMMARY OF THE INVENTION

Accordingly, it is a general object of the present invention to avoid the disadvantages of the prior art.

More particularly, it is an object of the present invention to develop a method of producing numerical values proportional to the frequency of measured pulses of a measured-pulse train, which method does not possess the disadvantages of the conventional methods of this kind.

Still another object of the present invention is to devise a method of the above type which is simple to perform, requires only simple operations, and gives reliable and accurate results nevertheless.

It is a concomitant object of the present invention to provide an arrangement for performing the above method, which is simple in construction, inexpensive to manufacture, easy to use, reliable, and which renders it possible to use only a minimum amount and size of hardware.

In pursuance of these objects and others which will become apparent hereafter, one feature of the present invention resides in a method of producing numerical values which are proportional to the frequency of measured pulses of a measured-pulse train, comprising the steps of detecting the number of periods of the measured pulses occurring during each of a succession of reference time intervals of a constant length; calculating from the detected number a coarse approximation numerical value; and supplementing the coarse approximation numerical value by a correction numerical value to obtain the sought numerical value, including measuring during each of the reference time intervals the time duration elapsed up to the occurrence of the last one of the measured pulses in the respective reference time interval, deriving from the difference between the time durations measured during successive ones of the reference time intervals an address of a memory table location, addressing the respective memory table location with the derived address to thereby retrieve the contents thereof which is proportional to the reciprocal value of the sum of the constant length of the reference time intervals and said difference, and combining the retrieved contents with the coarse approximation numerical value.

It will be possible by this method to produce a great range of the numerical values without there being any need for an extremely large memory capacity for the frequency values. Only a small calculating effort is required to allocate the read-out frequency values to the data format spanning the entire frequency range. Therefore, the frequency values are rendered available in a short time.

It is provided in a currently preferred construction according to this invention that clock pulses of constant frequency are summed up to form a counted value during the predetermined equally long reference time intervals in each case up to the last measured pulse in the reference time interval, the count value being memorized in a buffer store, that it is checked after each measured pulse, whether the measured-pulse interval is greater or smaller than the reference time interval, that in the event that the measured-pulse interval is smaller, the last but one buffer-stored counted value is subtracted from the last one, that the difference between the counted values is supplied as an address to a memory in dependence upon a measured-pulse count value which is obtained by summing up the measured pulses per reference time interval while adapting the difference value to the allocated class of the table values, in which memory a table is stored in which there is stored under each address that corresponds to a periodic value at least one number which contains in its numerator a constant and in its denominator the total of the reference time interval and the difference between the counted values, that the value at the memory outlet is multiplied by the measured-pulse counted value and by the number ensuing from the allocation to the class and will be added to the measured-pulse counted value, in that in the event of the reference time interval being smaller, the count value that occurred during the reference time interval with the last but one measured pulse will be subtracted from the counted value that occurred during the respective last reference time interval before the measured pulse and will be delivered as address to a further memory in dependence upon the number of the reference time intervals without any measured pulses that occurred between adjacent measured pulses and after division by the number of the reference time intervals without any measured pulses, wherein a further table is stored in a further memory, in which there is stored under each address that corresponds to a periodic value a number which contains in its numerator a constant and in its denominator the total of the reference time interval and the quotient of the difference between the counted values and the number of the reference time intervals without any measured pulses, and in that the output value of the further memory will be divided by the number of the reference time intervals during which no measured pulses occur.

This method allows the processing of pulse trains whose periods are shorter than the reference time interval as well as of pulse trains whose periods are longer than the reference time interval. In the case of short pulse periods, only a short time will be required to issue the value proportional to the frequency. Somewhat more time is needed to produce the value proportional to the frequency in long pulse periods. However, in the case of long pulse periods, there is available more time for the issuance of the frequency-proportional value anyway.

It has to be regarded as another advantage of this method that a very large range of pulse periods and pulse frequencies, respectively, can be processed. The frequency-proportional values will be available even in the case of short pulse periods and high frequencies, respectively, shortly after termination of the respective reference time interval and may be processed further in order to determine the slip between vehicle wheel speed and vehicle speed, for instance.

Suitably, the circuit configurations for the generation of the numerical values which are proportional to the frequency of the measured pulses are integrated in a chip. The spatial requirement of a like arrangement is very low. Besides, there results minor susceptibility to disturbances.

According to another aspect of the invention, an arrangement for implementing the above method is characterized in that clock pulses of a clock generator are adapted to be delivered to a first presettable counter whose carry-over output is fed back to the reset input of a second counter, the latter being acted upon by the measured pulses, and is also connected to the clock inputs of a first and a second measured-pulse count-value memory in that a first clock-pulse count-value memory is connected to the output of the first counter and is with its clock input adapted to be acted upon by the measured pulses and is with its outputs connected to a second clock-pulse count-value memory, a third clock-pulse count-value memory being inserted downstream of the latter memory, in that the first measured-pulse count-value memory is with its input connected to the measured-pulse counter and with its output to the input of a second measured-pulse count-value memory, in that the outputs of the measured-pulse count-value memories are connected each with comparators, the latter being connected to a logic switch circuit which is in connection with the clock inputs of the second and the third clock-pulse count-value memory, with the reset input of the second clock-pulse count-value memory and with the counting input as well as the reset input of a counter for reference time intervals without measured pulses, in that the second measured-pulse count-value memory is connected to the output of the first measured-pulse count-value memory, in that the inputs of a subtractor are connected to the outputs of the second and the third clock-pulse count-value memory, in that the outputs of the subtractor are connectible alternatively to a first or a second format-converting circuit by the action of switches which latter are actuatable by a third comparator that is connected to the counter for reference time intervals without measured pulses, in that the first format-converting circuit that is adjustable via the output of the first measured-pulse count-value memory communicates with the memory while the second format-converting circuit that is adjustable via the outputs of the third comparator communicates with the further memory, and in that the outputs of the memory are connected to a buffer store via the series connection of a multiplier of a third format-converting circuit and of a summer which are acted upon by the output of the first measured-pulse count-value memory, the buffer store being furthermore connected to a divider which has the output signals of the third comparator applied thereto, the divider having its further inputs connected to the outputs of the further memory. While entailing relatively little effort, this arrangement generates in a short time on the basis of measured pulses and clock pulses the values that correspond to the frequency of two successive measured pulses.

An advantageous construction of the arrangement for implementing the method resides in that a first counter adapted to be acted upon by clock pulses of a clock generator is connected with its data outputs to the data bus of a microcomputer, in that the carry-over output of the counter is fed back to the reset input and connected to the data bus, in that there is provided a counting register supplied with the measured pulses, in that the interrupt input of the microcomputer is acted upon by the measured pulses, and in that memories are connected with their inputs to the address bus and with their outputs to the data bus of the microcomputer.

When using a microcomputer, this arrangement can be adapted to perform different measuring actions quickly and in a simple way. Since no excessively time-consuming calculations are necessary to determine the frequency values, this determination of frequency values takes but a short time even if the microcomputer has a sequential mode of operation. The use of the microcomputer renders it possible to further process the obtained frequency values immediately and quickly with a view to calculating further values, for instance, the slip of wheels.

Preferably, the numerical values are stored in the memories under 8-bit bytes. A data format of 8 bit is sufficiently precise for the most practical applications. Therefore, the memory capacity required for a large frequency range is relatively small.

Preferably, the memories are programmed read-only memories. If so, great reliability in resisting disturbances can be achieved.

In an expedient construction, the data size of the numerical values issued is 16 bit.

Preferably, the measured-pulse counter is connected via pulse-former stages to a pulse generator actuatable upon rotation of a vehicle wheel. Because it permits low-cost manufacture, yet attains great accuracy and is able to process a large speed range, the arrangement described hereinabove can be advantageously used to determine the wheel speed in automotive vehicles.

BRIEF DESCRIPTION OF THE DRAWING

The above-mentioned and other features and objects of the invention will become more apparent by reference to the following description taken in conjunction with the accompanying drawing in which:

FIG. 2 is a block diagram of a modification of the arrangement of FIG. 1;

FIG. 3 is a diagram of the processing steps performed by the arrangement according to FIG. 2 to determine the numerical values.

DETAILED DESCRIPTION OF THE PREFERRED EMBODIMENTS

Figure 1:
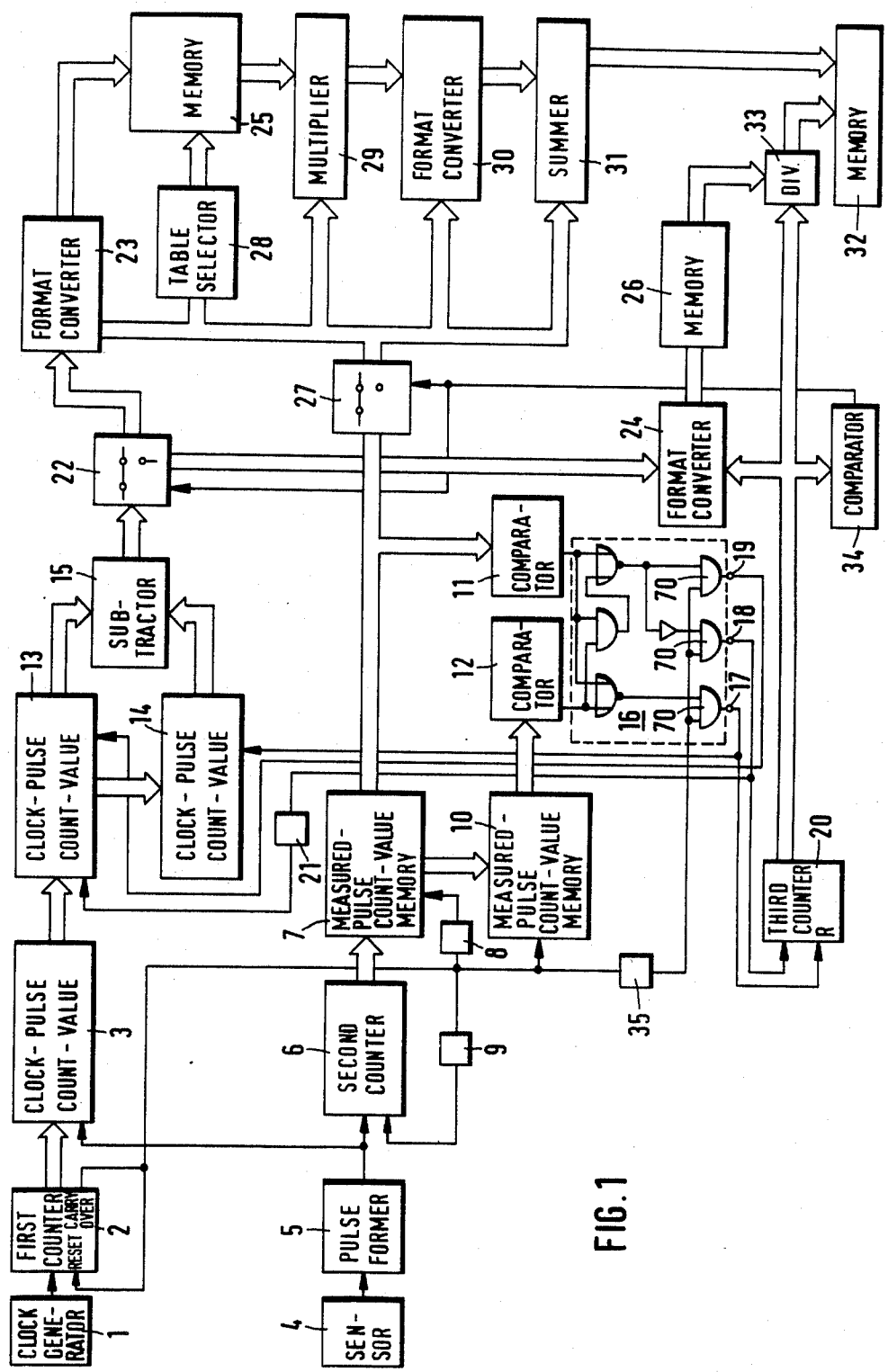
FIG. 1 is a block diagram of an arrangement of the present invention for the generation of numerical values which are proportional to the frequency of the measured pulses of a measured-pulse train.

Referring now to the drawing in detail, and first to FIG. 1 thereof, it may be seen that it depicts an arrangement for the generation of numerical values which are proportional to the frequency of measured pulses of a measured-pulse train. This arrangement comprises a clock generator 1 that produces clock pulses with constant frequency and a presettable first counter 2 which has a counting input that is connected to the clock generator 1. A carry-over output of the counter 2 is connected to a reset input of the counter 2. Parallel outputs of the first counter 2 are connected to corresponding inputs of memory locations which will collectively be referred to herein as a first clock-pulse count-value memory 3. The memory locations of the clock-pulse count-value memory 3, which are used as buffer stores, may be constituted by D-flip-flops whose D-inputs are connected to the outputs of the counter 2.

A sensor 4, which monitors the rotational speed of a vehicle wheel by means of a conventionally constructed pulse generator which is not disclosed in detail, feeds signals proportional to the rotational speed to a pulse former 5 which produces peak pulses. The pulse former 5 has an output that is connected to a counting input of a second counter 6 and to clock inputs of the clock-pulse count-value memory 3. This second counter 6 will be referred to herein as a measured-pulse counter. Parallel outputs of the measured-pulse counter 6 feed inputs of a first measured-pulse count-value memory 7 which contains a series of D-flip-flops the number of which corresponds to the number of the outputs of the counter 6. These counter outputs feed the corresponding D-inputs of such flip-flops, whose clock inputs are connected with the carry-over output of the counter 2 via a time delay device 8. The carry-over output of the counter 2 also feeds via a second time delay device 9 a resetting input of the measured-pulse counter 6. Parallel outputs of the D-flip-flops of the first measured-pulse count-value memory 7 are connected to corresponding inputs of D-flip-flops of a second measured-pulse count-value memory 10. Clock inputs of the D-flip-flops of the second measured-pulse count-value memory 10 are directly connected with the carry-over output of the first counter 2. Parallel outputs of the first measured-pulse count-value memory 7 are connected to a comparator 11, while parallel outputs of the second measured-pulse count-value memory 10 are connected to a comparator 12. These comparators 11 and 12 check the contents of the measured-pulse count-value memories 7 and 10 for the occurrence of the zero value thereat. Parallel outputs of the D-flip-flops of the first clock-pulse count-value memory 3 feed corresponding D-inputs of D-flip-flops of a second clock-pulse count-value memory 13 whose D-flip-flop outputs are connected, on the one hand, to corresponding D-flip-flop inputs of a third clock-pulse count-value memory 14 and, on the other hand, to corresponding inputs of a subtractor 15. Parallel D-flip-flop outputs of the third clock-pulse count-value memory 14 feed corresponding subtracting inputs of the subtractor 15.

Connected to outputs of the comparators 11 and 12 is a logic switching circuit 16 having three outputs 17, 18 and 19. The output 17 feeds a clock input of the third clock-pulse count-value memory 14 and a resetting input of a third counter 20 whose counting input is connected to the output 18, the latter being additionally connected via a time delay device 21 to clock inputs of the D-flip-flops of the second clock-pulse count-value memory 13. The output 19 is connected to a resetting input of the second clock-pulse count-value memory 13. Parallel outputs of the subtractor 15 are individually connectable via change-over switches 11 to a format converter 23, on the one hand, and to a format converter 24, on the other hand. Parallel outputs of the format converter 23 are connected to an address circuit of a memory 25 in which a table is stored whose structure will be explained in more detail hereinbelow. Parallel outputs of the format converter 24 are connected to address inputs of a further memory 26 in which a second table is stored which also will be explained in detail later.

The outputs of the first measured-pulse count-value memory 7 are further connected via switches 27 with corresponding control inputs of the format converter 23, with inputs of a table selector 28 by means of which the individual table values of the memory 25 can be selected, with inputs of a multiplier 29, with inputs of a third format converter 30 and with inputs of a summer 31, respectively. The multiplier 29 is connected to outputs of the memory 25. The format converter 30 is connected to outputs of the multiplier 29 and feeds second inputs of the summer 31 whose outputs are connected to inputs of a memory 32 serving to receive the frequency values. The inputs of the memory 32 are furthermore connected to outputs of a divider 33 whose inputs are individually connected to the outputs of the memory 26 and to the outputs of the third counter 20.

The outputs of the third counter 20 also control second inputs of the second format converter 24 as well as inputs of a third comparator 34, by whose outputs the position of the switches 22 and 27 is defined.

A reference time interval of constant duration is predetermined by the counter 2. This duration depends on the preset value of the counter 2. The counter 2 totals or counts the clock pulses arriving with constant frequency up to the preset value and is then reset to zero contents by the carry-over signal. Subsequently, the clock pulses will be totalled or counted again up to a counted value. The reference time interval may also be referred to as a period of time which will be designated by $T_F$ in the following discussion.

When the sensor 4 issues a signal which is converted into a pulse in the pulse former 5, the count then present in the first memory 2 is transferred to the first clock-pulse count-value memory 3. With each pulse at the output of the pulse former 5, the contents of the measured-pulse counter 6 will also be increased by one unit. When the carry-over signal appears at the first counter 2, the contents of the first measured-pulse count-value memory 7 will be supplied to the second measured-pulse count-value memory 10. After a short time delay determined by the time constant of the delay device 8, the contents of the measured-pulse counter 6 is transferred into the first measured-pulse count-value memory 7. After this, the measured-pulse counter 6 will be reset to zero contents by the action of the time delay device 9 whose time delay constant is slightly greater than that of the time delay device 8. The carry-over output of the counter 2 is also connected to the logic switch circuit 16. In dependence upon the occurrence of the carry-over signal, gate circuits 70 are rendered active to pass on signals to the outputs 17, 18 and 19.

The contents of the measured-pulse count-value memories 7 and 10 are designated by ZW 1 and ZW 2 in the following discussion. The contents ZW 1 and ZW 2 of the memories 7 and 10 are checked in the comparators 11 and 12 to determine whether they are zero. It shall first be assumed that both contents ZW 1 and ZW 2 are not equal to zero. This means that several measured pulses have occurred in each of two successive reference time intervals $T_F$. When the comparators 11 and 12 detect values for ZW 1 and ZW 2 other than zero, the carry-over signal of the counter 2 serves to produce a pulse at the output 17 by which the transfer of the contents of the second clock-pulse count-value memory 13 into the third clock-pulse count-value memory 14 will be effected. At the same time, the counter 20 will be reset to a preset value. This preset value is the number one. Subsequently, after a time delay caused by the time delay device 21, a pulse at the output 18 serves to effect the transfer of the contents of the first clock-pulse count-value memory 3 into the second clock-pulse count-value memory 13. The contents of the second and the third clock-pulse count-value memories 13 and 14 will be designated by ZW 11 and ZW 12 herein. Each transfer of a value into one of the memories 3, 7, 10, 13 and 14 has for its consequence that the previous memory contents is replaced by the transferred value.

A period duration $T_P$ of measured pulses in dependence upon the memory contents ZW 2, ZW 11 and ZW 12 as well as on the reference time interval $T_F$ can be obtained from the following formula:

$$T_P = \frac{T_F + ZW\,11 - ZW\,12}{ZW\,2} \cdot K,$$

with K being a constant. The frequency f of the measured pulses is the reciprocal value thereof:

$$f = \frac{1}{T_P} = K_1 \cdot \frac{ZW\,2}{T_F + ZW\,11 - ZW\,12} \tag{1}$$

with $K_1$ being the reciprocal value of K. This means that the frequency f is proportional to the memory contents ZW 2. In the arrangement described above, there is in each case added to a frequency-proportional approximate value ZW 2 a correction or table value assigned to the frequency value, the correction value being cointained in the memory 25. The input values of the table are derived from the difference ZW 11−ZW 12.

It will be particularly advantageous if the table-input values, i.e. the addresses of the memory 25, have a small address format. This is possible if the frequency f is determined from the following correlation:

$$f = K_2 \cdot ZW + ZW\,2 \left( \frac{K_1}{T_F + ZW\,11 - ZW\,12} - K_2 \right) \tag{2}$$

In this correlation, the constant $K_2$ has a selected value. The values of K, $K_1$ and $K_2$ depend on the selection of units for the period or the frequency. In the table of the memory 25, there are stored values having the following relationship to the difference values ZW 11−ZW 12:

$$\frac{K_1}{T_F + ZW\,11 - ZW\,12} - K_2$$

The value $K_2 \cdot ZW\,2$ represents a rough approximation of the frequency value. Therefore the value $$ZW\,2 \cdot \left( \frac{K_1}{T_F + ZW\,11 - ZW\,12} - K_2 \right)$$

only constitutes a correction value for the value $K_2 \cdot ZW\,2$.

The more precisely $K_2 \cdot ZW\,2$ approximates the frequency value f, the smaller the correction value can be. However, this implies that only a small address and data format is necessary for the correction value. From this there results savings in the required memory capacity.

The reference time interval $T_F$ can be 4.0 msec, for instance. The range to be covered for the velocity being monitored is, for example, from about 5 up to 280 km/h. In the selected example, the frequency at 280 km/h is to amount to 6600 hertz. The data in the memory 25 is subdivided into several classes. These classes can, for instance, comprise the speed ranges of 5 to 20, 10 to 40, 30 to 80, 70 to 160 and 150 to 280 km/h. The correction value has the same format for all classes, preferably 8 bit.

It shall be assumed that the frequency value is to be issued and further processed in a 16 bit format. The correction values in the memory 25 will now be allocated different significances. The allocation depends on the class and the accuracy required for this class. For instance, in the class between 150 and 280 km/h the correction values have significance in the range between $2^4$ and $2^{11}$. This allows to define the frequency values for the range between 150 and 280 km/h with sufficient accuracy. For the range between 70 and 160 km/h, the corresponding significance is between $2^5$ and $2^{12}$. The significances of the correction values for the remaining ranges of 30 to 90 km/h, 10 to 40 km/h and 5 to 20 km/h are shifted by one digit each in the binary code and amount to $2^6$ to $2^{13}$, $2^7$ to $2^{14}$ and $2^8$ to $2^{15}$, respectively. The digits of lower significance which are disregarded can also be considered to be approximated.

The number of correction values per class is also dependent on the desired accuracy. This number determines the required storage capacity of the memory 25. The difference ZW 11−ZW 12 can be positive or negative in dependence upon the increase or decrease of speed. For this reason, there are needed different memory locations for positive and negative values of the difference ZW 11−ZW 12. When the difference ZW 11−ZW 12 is positive, there results a negative correction value. The corresponding values will then be contained in the memory 25 as two's complement of the negative value.

It will not be required in the event of a maximum admissible error of four binary digits in the range of 150 to 280 km/h that the address format in full extent, as it results at the output of the subtractor 15, be supplied to the memory 25. When an address format of 16 bit is present at the output of the subtractor 15, an address reduced by $2^3$ will be sufficient for the addressing of the first class of the table in the memory. The output address of the subtractor 15 will therefore be divided by the value $2^3$ in the format converter 23. The format converter 23 is controlled by the contents of the measured-pulse count-value memory 7. In the case of a reference time interval of 4.0 msec and a frequency variation of 6600 hertz to 2983 hertz for the range of 160 to 280 km/h, the contents of the measured-pulse count-value memory 7 can vary between the decimal values 16 and 27. Corresponding to the decimal values 16 to 27 is therefore a division by the value $2^3$ in the format converter 23. The outputs of the format converter 23 are, for instance, connected to the line address circuit of the matrix memory 25. Connected to the column address circuit will be the outputs of the measured-pulse count-value memory 7 for the purpose of selecting the class of the table. The decimal values 16 to 27 or their corresponding binary equivalents will consequently select that class of the table which corresponds to the speed range 150 to 280 km/h. The class of the table for the range between 150 and 280 km/h preferably contains forty-eight memory locations of 8 bit each for negative difference values, while for positive difference values there will suffice fifty-six memory locations of 8 bit each. The following table indicates the classes of the table provided for the different speed ranges, the memory capacity requirement per class as well as the range of the contents of the measured-pulse count-value memory 7 and the extent of the address change by the format converter 23.

| speed range in km/h | variation range of the contents of the measured-pulse count value memory 7 | division factor for the output value of the subtractor 15 | memory capacity requirement for the table | |
|---|---|---|---|---|
| | | | positive difference values | negative difference values |
| 150...280 | 16...27 | $2^3$ | 56 × 8 bit | 49 × 8 bit |
| 70...160 | 8...15 | $2^4$ | 60 × 8 bit | 47 × 8 bit |
| 30...80 | 4...7 | $2^5$ | 70 × 8 bit | 42 × 8 bit |
| 10...40 | 2...3 | $2^6$ | 109 × 8 bit | 35 × 8 bit |
| 5...20 | 1 | $2^7$ | 52 × 8 bit | 26 × 8 bit |

The total memory capacity requirement is thus 541 × 8 bits. In consequence, with the frequency values being very exact, only a small memory capacity is required for a large speed range.

The correction values that are read out from the memory 25 in the form of 8-bit bytes arrive at the multiplier 29 in which they are multiplied by the contents of the measured-pulse count-value memory 7. It is desired that the frequency values be available in a format of 16-bit size. Therefore, the numerical values allocated to the respective classes will be multiplied in the format converter 30. The same numbers that have already been used for the division of the corresponding class will be used for the multiplication. The five classes shown in the table will thus be multiplied each by $2^3$, $2^4$, $2^5$, $2^6$ or $2^7$. The multiplication is executed in the binary code, a multiplication by the factor of 2 corresponding to a shift operation performed by one digit to the left. The shift by one digit to the right means a binary division by the factor of 2. After the multiplication in the format converter 30, the correction data in the format of 16 bits is available within this format with the correct significance. Added to these data will be the contents of the measured-pulse count-value memory 7. From this will then result the frequency value f according to the above-mentioned correlation (2). This frequency value is supplied from the summer 31 into the memory 32 which latter stores the result.

When the comparators 11 and 12 detect that the contents of the measured-pulse count-value memory 7 equals zero, while the contents of the measured-pulse count-value memory 10 is greater than zero, the logic switch circuit 16 initiates the transfer of the contents of the clock-pulse count-value memory 13 into the clock-pulse count-value memory 14. Afterwards, the contents of the clock-pulse count-value memory 13 will be reset to zero. Simultaneously, the contents of the memory 20 will be increased by one unit.

When the comparators 11 and 12 detect that the contents of the measured-pulse count-value memories 7 and 10 are equal to zero, the logic switch circuit 16 increases the contents of the counter 20 by one unit, while the contents of the clock-pulse count-value memory 13 is reset to zero and the contents of the clock-pulse count-value memory 14 is maintained.

If, on the other hand, the contents of the measured-pulse count-value memory 7 is greater than zero, while the contents of the measured-pulse count-value memory 10 is still zero, the comparators 7, 10 will actuate via the logic switch circuit 16 the transfer of the contents of the clock-pulse count-value memory 3 into the clock-pulse count-value memory 13. The contents of the clock-pulse count-value memory 14 is maintained, while the logic switch circuit 16 increases by one the contents of the counter 20. With the counter contents being as referred to above, the period duration of the measured pulses is greater than the reference time interval $T_F$. The period duration $T_P$ of the measured pulses will then result on the basis of the contents of the counter 20 and of the clock-pulse count-value memories 13 and 14 pursuant the correlation:

$$T_P = K \cdot (Z3 \cdot T_F + ZW11 - ZW12).$$

In this correlation, K is the constant, Z 3 is the contents of the counter 20, $T_F$ is the reference time interval and ZW 11 and ZW 12, respectively, the contents of the clock-pulse count-value memories 13 and 14.

The frequency of the measured pulses F results from the reciprocal value of $T_P$ pursuant the following correlation:

$$F = \frac{1}{T_P} = \frac{K3}{Z3 \cdot T_F + ZW11 - ZW12} \quad (3)$$

where $K_3$ is the reciprocal value of K.

Besides ZW 11−ZW 12, the denominator in this correlation still contains the term Z 3·$T_F$. Consequently, F cannot be determined according to the method described hereinabove. A somewhat modified method will be used instead. The frequency F results from the correlation (3) by conversion into the correlation:

$$F = \frac{1}{Z3} \cdot \frac{K3}{T_F + (ZW11 - ZW12)Z3} \quad (4)$$

Stored in the memory 26, in turn, is a table whose addresses are derived from the difference ZW 11−ZW 12 by having these addresses divided once again in the format converter 24 by the contents of the counter 20. Since the measured-pulse period is longer than the reference time interval, already a relatively exact frequency value is already obtained from the contents of the counter 20. Therefore, the table values are permitted to be less exact. For this reason, the difference values ZW 11−ZW 12 are divided in the format converter 24 to assume the lowest stage of precision which has been indicated hereinabove by $2^7$ in the table of the memory 25. With this address, the values contained in the table for $$K3 \cdot \frac{1}{T_F + \frac{ZW11 - ZW12}{Z3}}$$

are selected and read out.

The output values of the memory 26 are delivered to the divider 33 in which they are divided by the contents of the counter 20. Subsequently, there is available at the output of the divider 33 the frequency value F which is supplied to the memory 32. The switches 22, 27 are controlled by the comparator 34 which monitors the counter 20 to determine whether its contents exceeds one. When the answer to this question is affirmative, the comparator 34 will change the switch 22 over to the input of the format converter 24, while it actuates the switch 27 to assume the open position. The memory 26 will be addressed in this case, and its contents will be supplied to the memory 32 as the frequency value F after having been converted in a corresponding manner.

The division of the value read out of the memory 26 represents a format conversion. There will be no need for a further format conversion, because there are stored in the memory 26 only values for low speeds which require but a small data size anyway.

With the exception of sensor 4, the switching elements illustrated in FIG. 1 are preferably integrated in a chip. Weight and volume can be thereby economized.

A modification of the arrangement for issuing a value which corresponds to the frequency of adjacent pulses which is shown in FIG. 2 again includes the clock generator 1 having its output connected to the counter 2 whose carry-over output is fed back to its reset input. The parallel output lines 35 of the counter 2 are connected to the bus 36 of a microcomputer 37. The bus 37 comprises control, data and address lines not described in more detail, which respectively form a control, data and address bus. Preferably, the address format is 16 bit and the data format 8 bit. The counter 2 advantageously has 16 parallel outputs. In this arrangement, the counter 2 can be a binary counter. As the data bus format is 8 bit, the 16 bits of the binary counter 2 will have to be transferred onto the data bus successively per 8 bit each. The data transmission is suitably performed via a buffer store which can include memory locations within a random access memory 38 connected to the bus 36. The carry-over output of the counter 2 is connected to the control bus. A microprocessor 39 as well as read-only memories 40, 41 and an input and output circuit 42 are also connected to the bus 36. The sensor 4 delivers signals to the interrupt input of the microcomputer 37 via pulse-former circuits 5 and the input and output circuit 42. The read-only memories 40, 41 contain each one of the tables that have been explained in detail hereinabove in connection with the memories 25, 26. Simultaneously, the clock generator 1 delivers the system clock for the microprocessor 39. The counter 2 is preferably a component of the microprocessor 39.

In the graph shown in FIG. 3, the contents of the counter 2 is referred to as Z 1. In the memory 38 (RAM), a part of the memory can be determined as counter memory whose content is increased by one unit upon the occurrence of each measured pulse. The content of this counter memory part in the memory 38 is designated by Z 2. The counter memory part can suitably be a register of the microprocessor 39. Another register of the microprocessor 39 serves to receive the contents of the counter 2. The contents of this register is referred to as ZW 11. To memorize the contents of the counter 2, still another register whose contents is referred to as ZW 12 is arranged for in the microprocessor 39. Two further registers whose contents are designated by ZW 2 and ZW 21 in FIG. 3 serve as buffer stores for the contents Z 2 of the counter memory.

After the delivery of the respective frequency value f or F, in a step 43 the contents ZW 2 will be introduced into the register with ZW 21 which will then contain the data of ZW 2. Subsequently, Z 2 will be transferred to ZW 2 in a step 44. In a step 45, check is made whether ZW 2 equals zero. If this condition is satisfied, a step 46 will come next which includes another interrogation as to whether ZW 21, too, equals zero. Provided this is the case, there ensues a step 47 in which the contents of a further register of the microprocessor 39 is increased by one unit, this contents being designated by Z 3. After this, the frequency value f or F will be determined in an operation referred to as 48 in FIG. 3. Following the operation 48, step 43 recommences. If it is found out in step 46 that ZW 21 is not equal to zero, a step 49 will follow in which ZW 11 is transferred to ZW 12. At the same time, ZW 11 will be reset to zero, while Z 3 is set to two. Step 49 will be followed by step 48 again.

If Z 2 is different from zero in step 45, a step 50 will follow which calls for an interrogation referring to ZW 21. If ZW 21 equals zero, these ensues a step 51 in which Z 1 is transferred to ZW 11. At the same time, Z 2 and Z 3 will be reset to zero before the operation 48 occurs. However, if it is detected in the step 50 that ZW 21 is different from zero, there follows a step 52 which comprises the transfer of ZW 11 to ZW 12, the transfer of Z 1 to ZW 11 and the resetting of Z 2 and Z 3 to zero. Then, the operation 48 will recommence.

Figure 4:
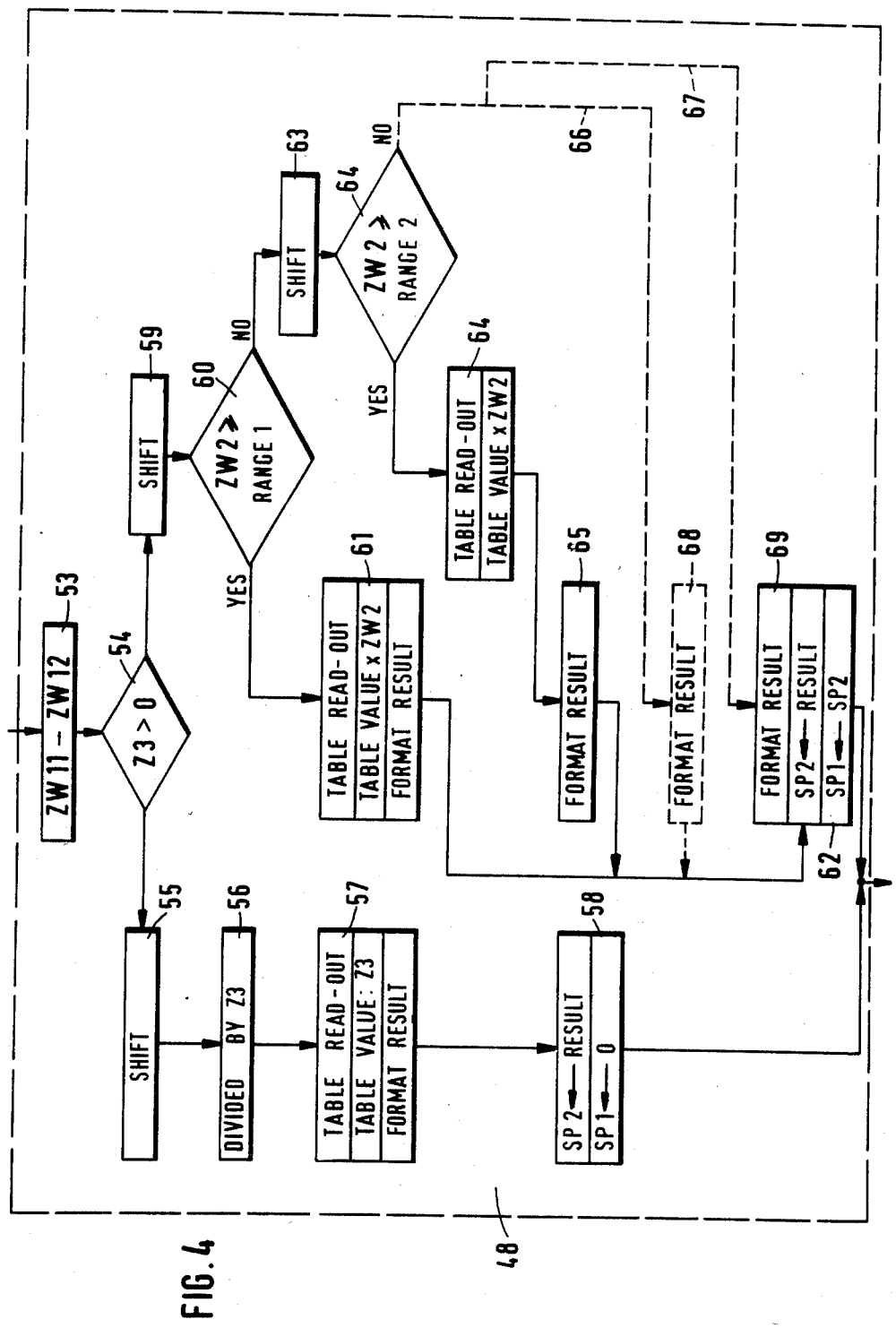
FIG. 4 shows details of the diagram illustrated in FIG. 3.

As is illustrated in more detail in FIG. 4, the operation 48 starts with a step 53 in which ZW 12 is subtracted from ZW 11. Then check is made in a step 54 whether the contents Z 3 is greater than zero. In the negative, there follows a shift operation in a step 55. The difference ZW 11−ZW 12 will be divided by $2^8$ by means of several shifts. This corresponds to the class with the smallest speed range according to the table explained hereinabove, which is present in the memory 26, for instance. In the next step 56, the result obtained in the step 55 will be divided by Z 3. In doing so, there results a value which serves to address a table which is identical with that one in the memory 26. This table is contained in the read-only memory 41 in the arrangement according to FIG. 2. The addressing action of the memory 41 that is performed in the following step 57 has for its result a memory output value which will be divided by Z 3 and will then be multiplied by $2^8$. The result of the step 57 will be supplied in the following step 58 to a register SP 2 or to a memory location SP 2 of the memory 38, respectively. This relates to the eight low-value bits of the memory. The eight higher-value bits will be reset to zero. Step 43 will then follow.

However, if Z 3 is not equal to zero, a step 59 will follow in which the difference ZW 11−ZW 12 is subjected to a shift operation which corresponds to a division by 2. After this shift operation, it will be checked in a step 60, whether ZW 2 corresponds to the values for the highest speed class of the table. If this is the case, there follows as a step 61 the addressing of the memory 40 with the result of the step 59 as its address, the multiplication of the memory output value by ZW 2 and format modification by a binary multiplication being produced by a shift operation. Subsequently, the correction value will be available with the right significance. This correction value will be stored in SP 2 in a step 62 which forms the eight lower-value bits of a byte comprising sixteen bits. The eight higher-value bits are formed by the contents ZW 2 which is transferred to the memory location with the eight higher-value bits. This memory location is referred to as SP 1 in FIG. 4.

If it is detected in the step 60 that ZW 2 is greater than the value predetermined for the highest class, another shift step 63 will be performed in which the difference ZW 11−ZW 12 is divided by one binary digit. It will then be examined in a step 64, whether ZW 2 is greater than or equal to the predetermined value for the next lower class of the table in the memory 40. If this is true, there follows a step 64 which calls for the memory read-out operation and the multiplication of the output value of the memory by ZW 2. The result of this multiplication will be transformed in the next step 65 into the necessary format in which a multiplication by two binary digits will be executed before step 62 follows. A sequence of steps corresponding to those of 63, 64 and 65 will be carried out after step 64 for each memory class. In FIG. 4, this is indicated by the dotted lines 66 and 67 which terminate each in format-converting steps 68 and 69 which are followed by the step 62.

It is possible to use the arrangement illustrated in FIG. 2 for the time-division multiplex calculation of frequency values. To this end, several sensors are connected via corresponding pulse formers and interface circuits to the bus 36. The sequence of steps shown in FIGS. 3 and 4 will be performed for each sensor in a predeterminable order.

The circuit configurations illustrated in FIG. 4 are, with the exception of the sensor 4 and the pulse former 5, integrated in a chip.

A table appearing hereinbelow shows for each frequency of a specific frequency range the approximate or coarse value and the correction value contained in the binary code in the memory as expressed in the decimal code. These values apply to a reference time interval $T_F = 4$ msec for K 1 = 1 as well as for K 2 = 100 and for the above-mentioned frequency range.

In the following table, there are shown frequency values and periodic values pertaining to the signals produced by the sensor 4. Furthermore, the table shows the approximate values for the frequencies. These approximate values are obtained in the measured-pulse count-value memories 7, 8 and in the microcomputer 37, respectively. It is pointed out in the corresponding column of the table that the approximate values will have to be multiplied by a constant. Besides, the table contains the difference values for the formation of the memory addresses as well as the correction values stored under the addresses indicated. The difference values are subject to a format conversion as it is carried out in the format converter 23, for example. Another column of the table contains the result of the multiplication of the stored correction values by the approximate values. The result is present, for instance, at the output of the multiplier 29. Finally, the table shows in the last column the results of the determination of the period durations on the basis of the approximate values and the correction values.

| frequency determined by sensor 4 (hertz) | periodic value for the frequency (msec) | approximate value (hz) | difference values for the generation of the address of the memory | correction value in the memory | multiplication result (hertz) | addition result (hertz) |
|---|---|---|---|---|---|---|
| 1000 | 1 | 4 · K2 | 0 | 150 | 600 | 1000 |
| 1200 | 0,833 | 4 · K2 | $0,333 \cdot 10^{-3}$ | 200 | 800 | 1200 |
| 1500 | 0,667 | 6 · K2 | 0 | 150 | 900 | 1500 |
| 1800 | 0,555 | 7 · K2 | $0,389 \cdot 10^{-3}$ | 157 | 1099 | 1799 |
| 2000 | 0,500 | 8 · K2 | 0 | 150 | 1200 | 2000 |
| 2200 | 0,4545 | 8 · K2 | $0,364 \cdot 10^{-3}$ | 175 | 1400 | 2200 |
| 2500 | 0,400 | 10 · K2 | 0 | 150 | 1500 | 2500 |
| 2800 | 0,3571 | 11 · K2 | $0,393 \cdot 10^{-3}$ | 154 | 1694 | 2794 |

-continued

| frequency determined by sensor 4 (hertz) | periodic value for the frequency (msec) | approximate value (hz) | difference values for the generation of the address of the memory | correction value in the memory | multiplication result (hertz) | addition result (hertz) |
|---|---|---|---|---|---|---|
| 3000 | 0,3333 | 12 · K2 | 0 | 150 | 1800 | 3000 |
| 3200 | 0,3125 | 12 · K2 | $0,375 \cdot 10^{-3}$ | 167 | 2004 | 3204 |
| 3500 | 0,2857 | 14 · K2 | 0 | 150 | 2100 | 3500 |
| 3800 | 0,2631 | 15 · K2 | $0,394 \cdot 10^{-3}$ | 153 | 2295 | 3795 |
| 4000 | 0,250 | 16 · K2 | 0 | 150 | 2400 | 4000 |
| 4200 | 0,238 | 16 · K2 | $0,381 \cdot 10^{-3}$ | 162 | 2592 | 4192 |
| 4500 | 0,222 | 18 · K2 | 0 | 150 | 2700 | 4500 |
| 4600 | 0,217 | 18 · K2 | $0,392 \cdot 10^{-3}$ | 156 | 2808 | 4608 |
| 5000 | 0,200 | 20 · K2 | 0 | 150 | 3000 | 5000 |
| 5500 | 0,182 | 22 · K2 | 0 | 150 | 3300 | 5500 |
| 6000 | 0,167 | 24 · K2 | 0 | 150 | 3600 | 6000 |
| 6660 | 0,1501 | 26 · K2 | $0,390 \cdot 10^{-3}$ | 156 | 4056 | 6656 |

According to the preceding table, the frequency range is divided correspondingly coarsely. However, it can be recognized clearly that addresses in different ranges are equal, like the table values. This means an economy in memory locations. In addition, three-digit correction values will suffice to produce numerical values with high precision.

While I have described above the principles of my invention in connection with a specific arrangement, it is to be clearly understood that this description is made only by way of example and not as a limitation to the scope of my invention as set forth in the objects thereof and in the accompanying claims.

I claim:

1. A method of producing final numerical values which are proportional to the frequency of measured pulses of a measured-pulse train, comprising the steps of:

detecting the number of periods of said measured pulses occurring during each of a succession of reference time intervals of a constant length;

calculating from said detected number a coarse approximation numerical value; and supplementing said coarse approximation numerical value by a correction numerical value to obtain said final numerical value, including measuring during each of said reference time intervals the time duration elapsed from the beginning of said reference time interval to the occurrence of the last one of said measured pulses in the respective one of said reference time intervals, deriving from the difference between said time durations measured during successive ones of said reference time intervals an address of a memory table location, addressing the respective one of said memory table locations with said derived address to thereby retrieve the contents thereof, said contents being proportional to the reciprocal value of the sum of said constant length of said reference time intervals and said difference, and combining said retrieved contents of said addressed memory table location with said coarse approximation numerical value.

2. The method as defined in claim 1, wherein some of said memory table locations have a size which is smaller than the number of binary digits required to express said final numerical values throughout the frequency range of said measured pulses, and said supplementing step further includes subdividing the frequency range of said measured pulses into a plurality of classes of sub-ranges, assigning a set of said memory table locations to each of said classes, allocating to said memory table locations of each of said sets a numerical significance which is different from that of the memory table locations of others of said sets and is appropriate for the accuracy required from said correction numerical values in the associated one of said classes, and storing said correction numerical values with the required accuracy in the ones of said respective memory table locations of each of said respective sets, including approximating the binary bits of lesser significance than the lowest significant binary bits fitting into the respective ones of said memory table locations of the respective one of said sets.

3. The method as defined in claim 2, and further comprising the step of expanding said retrieved contents of the respective one of said addressed memory table locations prior to said combining step by inserting after the lowest significant bit thereof a number of binary zeros corresponding to the number of binary bits disregarded during said storing step to thereby give said correction numerical value said numerical significance relative to said coarse approximation numerical value which is allocated to the respective one of said sets.

4. The method as defined in claim 2, wherein said assigning step includes giving each of said sets of said memory table locations a range of addresses of address sizes different from that given to said other sets of said memory table locations, said address sizes differing from each other by the number of said approximated bits.

5. The method as defined in claim 2, and further comprising the step of dividing said difference between said time durations measured during said successive ones of said reference time intervals by a number corresponding to the number of said approximated bits.

6. The method as defined in claim 1, wherein said measuring step includes generating a succession of clock pulses of constant frequency, counting the number of said clock pulses occurring since the beginning of the respective one of said reference time intervals up to the occurrence of the last one of said measured pulses in the respective one of said reference time intervals to obtain a counted value, and storing said counted value.

7. The method as defined in claim 6, and further comprising the step of checking after the occurrence of each of said measured pulses whether the duration of the period of said measured pulses is greater or less than the duration of said reference time interval.

8. The method as defined in claim 7, wherein said supplementing step further includes subdividing the frequency range of said measured pulses into a plurality of classes, assigning a set of said memory table locations to each of said classes, and storing in the respective one of said memory table locations of the respective one of said sets a correction numerical value appropriate for the respective one of said classes.

9. The method as defined in claim 8, wherein, when the result of said checking step is that said duration of said period of said measured pulses is less than said duration of said reference time interval, said deriving step includes subtracting from the last of said counted values said stored next-to-last counted value to obtain said difference value, said addressing step includes modifying said difference value as a function of the number of periods of said measured pulses occurring during the respective ones of said reference time intervals obtained in said detecting step to derive therefrom the respective one of said addresses within said range of addresses of said memory table locations of said set assigned to the respective one of said classes of frequencies, said storing step includes storing in the respective one of said memory locations a number having the value of a fraction having a constant in its numerator and the sum of said duration of said reference time interval and said difference value used in said addressing step in its denominator, and said combining step includes multiplying said retrieved contents of said addressed memory table location by the number of periods of said measured pulses occurring during the respective one of said reference time intervals and by a number resulting from said allocation to one of said respective classes, and adding the result of said multiplication to said coarse approximation numerical value.

10. The method as defined in claim 8, wherein, when the result of said checking step is that said duration of said period of said measured pulses is greater than said duration of said reference time interval containing the last of said measured pulses, said deriving step includes substracting from said counted value obtained during said reference time interval containing the last of said measured pulses, said stored counted value obtained during said reference time interval containing the next-to-last of said measured pulses, to obtain said difference value, said addressing step includes modifying said difference value as a function of the number of said reference time intervals not containing any of said measured pulses intervening between said reference time intervals containing said last and next-to-last measured pulses, to derive therefrom the respective one of said addresses within said range of addresses of said memory table locations of said set assigned to the respective one of said classes of frequencies, said storing step includes storing in the respective one of said memory table locations a number having the value of a fraction having a constant in its numerator and the sum of said duration of said reference time intervals and the quotient of said difference value and said number of intervening reference time intervals not containing any of said measured pulses in its denominator, and wherein said combining step includes dividing said retrieved contents of said addressed memory table location by said number of intervening reference time intervals not containing any of said measured pulses.

11. The method as defined in claim 7, wherein said checking step includes examining each successive one of said reference time intervals for the occurrence of one of said measured pulses during the same, and issuing a first indication in the presence, and a second indication in the absence, of such occurrence during the respective one of said reference time intervals.

12. The method as defined in claim 11, wherein said checking step further includes, upon issuance of said second indications during two successive ones of said reference time intervals, increasing said counted value by one unit for said reference time intervals not containing any of said measured pulses.

13. The method as defined in claim 11, wherein said checking step further includes, upon issuance of said second indication during said last one of said reference time intervals and of said first indication during said next-to-last one of said reference time intervals, setting said counted value to one for said reference time intervals not containing any of said measured pulses.

14. The method as defined in claim 11, wherein said deriving step includes subtracting, from said counted value obtained during said reference time interval containing said last one of said measured pulses, said counted value obtained during said reference time interval containing said next-to-last one of said measured pulses, to obtain said difference value and, upon the issuance of said second indication during said next-to-last one of said reference time intervals and of said first indication during said last one of said reference time intervals, and further comprising the step of dividing said retrieved contents of said addressed memory table location by said number of said reference time intervals not containing any of said measured pulses that intervene between said next-to-last one and said last one of said reference time periods, and storing the result of such division.

15. The method as defined in claim 11, and further comprising, upon the issuance of said first indications during said last one and said next-to-last one of said reference time intervals, the step of storing said counted values obtained during such reference time intervals.

16. An arrangement for producing final numerical values which are proportional to the frequency of measured pulses of a measured-pulse train, comprising:
means for detecting the number of periods of said measured pulses occurring during each one of a succession of reference time intervals and the time duration elapsed during each of said reference time intervals up to the occurrence of the last one of said measured pulses during the respective one of said reference time intervals; and
means for calculating from said detected number a coarse approximation numerical value and calculating from said detected durations a correction numerical value, and from said coarse approximation and said correction numerical values calculating said final numerical value.

17. The arrangement as defined in claim 16, wherein said detecting means includes a clock generating clock pulses, a first counter having a counting input connected to said clock, a reset input, a carry-over output connected to said reset input, and data output means, a second counter having a data input receiving said measured pulses, a reset input and data output means, and means for applying a signal appearing on said carry-over output of said first counter after a time delay to said reset input of said second counter; and wherein said calculating means includes a first and a second measured-pulse count-value memory each having a clock input connected to said carry-over output of said first counter, a first clock-pulse count-value memory connected to said first counter data output means and having a clock input, means for causing said measured pulses to act on said first clock-pulse count-value memory clock input, a second clock-pulse count-value memory having a reset input and connected in series with said first clock-pulse count-value memory, a third clock-pulse count-value memory connected in series with said second clock-pulse count-value memory, means for connecting said first measured-pulse count-value memory in series between said second counter and said second measured-pulse count-value memory, an additional counter of reference time intervals not containing any of said measured pulses, said additional counter having counting and reset inputs, a pair of comparators, means for supplying data from each of said first and second measured-pulse memories to a different one of said comparators, a logic switching circuit, means for feeding signals from said comparators to said logic switching circuit, means for supplying output signals from said logic switching circuit to said clock inputs of said second and third clock-pulse count-value memories, to said reset input of said second clock-pulse count-value memory, and to said counting and reset inputs of said additional counter, a subtractor having inputs respectively receiving output signals from said second and third clock-pulse count-value memories, a first and a second format-converting circuit, means for adjusting said first format-converting circuit as a function of an output of said subtractor, means including switches for selectively connecting outputs from said subtractor to said format-converting circuits, an additional comparator acted upon by an output of said additional counter, means for operating said switches as a function of the output of said additional comparator, a first auxiliary memory receiving an output of said first format-converting circuit, a second auxiliary memory receiving an output of said second format-converting circuit, a buffer storage, a multiplier, a third format-converting circuit, and a summing device interposed in series between said first auxiliary memory and said buffer storage, means for supplying an output of said first measured-pulse count-value memory to said multiplier, said third format-converting circuit, and said summing device, a divider having first and second inputs, means for feeding an output of said buffer storage to said first inputs of said divider, means for controlling said divider as a function of an output of said additional comparator, and means for connecting outputs of said second memory to said second inputs of said divider.

18. The arrangement as defined in claim 16, wherein said detecting means includes a counter having a counting input, a reset input, data outputs and a carry-over output connected to said reset input, said counter being arranged to count clock pulses supplied to said counting input thereof, and wherein said calculating means includes a microcomputer having a data bus connected to said data and carry-over outputs of said counter, an interrupt input receiving said measured pulses, an output bus, and an address bus, and auxiliary memories having respective inputs connected to said output bus and respective outputs connected to said data bus of said microcomputer.

19. The arrangement as defined in claim 18, wherein said microcomputer further includes a system clock, and wherein said clock pulses are derived from said system clock.

20. The arrangement as defined in claim 16, wherein said calculating means includes memories for storing said correction numerical values, said memories having memory table locations of 8-bit byte sizes.

21. The arrangement as defined in claim 16, wherein said calculating means includes memories for storing said correction numerical values, said memories being programmed read-only memories.

22. The arrangement as defined in claim 16, wherein said calculating means is arranged to supply said final numerical value in a 16-bit size.

23. The arrangement as defined in claim 16, and further comprising means for converting rotation of a vehicle wheel into said measured pulses, including a pulse generator arranged to monitor the rotation of the vehicle wheel and issue a signal as a function of the speed thereof, and a pulse former arranged to convert said signal into a series of said measured pulses and to supply the latter to said detecting means.

* * * * *